(12) United States Patent
Guo et al.

(10) Patent No.: US 10,230,370 B2
(45) Date of Patent: Mar. 12, 2019

(54) DATA TRANSMISSION WITH POWER SUPPLY NOISE COMPENSATION

(71) Applicant: ATI Technologies ULC, Markham (CA)

(72) Inventors: Fei Guo, Ottawa (CA); Mark Edward Frankovich, Markham (CA)

(73) Assignee: ATI TECHNOLOGIES ULC, Markham, Ontario (CA)

( * ) Notice: Subject to any disclaimer, the term of this patent is extended or adjusted under 35 U.S.C. 154(b) by 10 days.

(21) Appl. No.: 15/496,848

(22) Filed: Apr. 25, 2017

(65) Prior Publication Data

US 2018/0309448 A1 Oct. 25, 2018

(51) Int. Cl.
| | |
|---|---|
| G11C 5/14 | (2006.01) |
| H03K 19/003 | (2006.01) |
| H04B 15/02 | (2006.01) |
| G05F 1/571 | (2006.01) |
| G05F 1/595 | (2006.01) |
| G05F 1/56 | (2006.01) |

(52) U.S. Cl.
CPC ....... *H03K 19/00346* (2013.01); *H04B 15/02* (2013.01); *G05F 1/562* (2013.01); *G05F 1/571* (2013.01); *G05F 1/595* (2013.01)

(58) Field of Classification Search
CPC ....... H01L 2924/00; H01L 2924/00014; H01L 2924/01015; H01L 2924/14; H01L 2924/3025; H01L 2224/43; H01L 2224/45099; H01L 2224/45565; H01L 2224/45572; H01L 2224/48092
USPC ........ 365/230.03, 63, 189.14, 198, 214, 226
See application file for complete search history.

(56) References Cited

U.S. PATENT DOCUMENTS

| | | | |
|---|---|---|---|
| 7,924,637 B2 | 4/2011 | Searles et al. | |
| 7,961,533 B2 | 6/2011 | Searles | |
| 2003/0086501 A1* | 5/2003 | Dreps | ..................... H04L 1/242 375/257 |
| 2016/0172013 A1 | 6/2016 | Dearth et al. | |

* cited by examiner

*Primary Examiner* — Thong Q Le
(74) *Attorney, Agent, or Firm* — Polansky & Associates, P.L.L.C.; Paul J. Polansky (57) ABSTRACT

In one form, a data transmission system includes transmission and reception circuits. The transmission circuit includes a first driver having an input for receiving a first transmit data signal, an output, a positive power supply terminal for receiving an input/output (I/O) power supply voltage, and a negative terminal for receiving an I/O ground voltage, a second driver having an input for receiving the I/O power supply voltage, an output, and a positive power supply terminal for receiving the I/O power supply voltage, and a third driver having an input for receiving the I/O ground voltage, an output, and a negative power supply terminal coupled to the I/O ground voltage. The reception circuit forms a reference voltage based an average of signal content below a predetermined frequency of outputs of the second and third drivers, and receives a signal from the output of the first driver using the reference voltage.

20 Claims, 7 Drawing Sheets

FIG. 9 ated verb forms include both direct connection and indirect electrical connection by means known in the art, and unless otherwise noted any description of direct connection implies alternate embodiments using suitable forms of indirect electrical connection as well.

DATA TRANSMISSION WITH POWER SUPPLY NOISE COMPENSATION

BACKGROUND

Computer systems have benefited from several different advances in technology that have taken place over the last several decades. One of the most important advances has come in integrated circuit fabrication technology, especially for complementary metal-oxide-semiconductor (CMOS) technology. Modern CMOS technology has allowed the development of high-speed, low-power and low-voltage integrated circuits. One type of integrated circuit that has benefited from improvements in CMOS technology is integrated circuit memory. In order to take full advantage of the speed capabilities of CMOS technology, the Joint Electron Devices Engineering Counsel (JEDEC) has developed specifications for computer memory integrated circuits that operate at very high clock speeds, for example several gigahertz (GHz), and that can transfer data on both edges of the clock signal.

However when operating at speeds as high as several GHz, integrated circuit memories require receivers that are sensitive enough to capture the correct logic state of the data when the difference between a logic high state and the logic low state is only a few hundred millivolts (mV). Because of the small voltage swing, transmission and reception of data is susceptible to different environmental factors that can cause data transmission failure. One of those factors is noise that includes not only random energy fluctuations but also electromagnetic interference (EMI) absorbed from the surrounding environment. To reduce the occurrence of reception errors and increase memory operating speed, therefore, it would be useful to reduce the sensitivity of integrated circuits to environmental noise.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

As will be described below in one form, a data transmission system includes a transmission circuit and a reception circuit. The transmission circuit includes a first driver having an input for receiving a first transmit data signal, an output, a positive power supply terminal for receiving an input/output (I/O) power supply voltage, and a negative terminal for receiving an I/O ground voltage, a second driver having an input for receiving the I/O power supply voltage, an output, and a positive power supply terminal for receiving the I/O power supply voltage, and a third driver having an input for receiving the I/O ground voltage, an output, and a negative power supply terminal coupled to the I/O ground voltage. The reception circuit is coupled to the outputs of the first, second, and third drivers. The reception circuit forms a reference voltage based an average of signal content below a predetermined frequency of outputs of the second and third drivers, and receives a signal from the output of the first driver using the reference voltage.

In another form, a data transmission circuit includes a transmission circuit and a reception circuit. The transmission circuit includes a first driver and a second driver. The first driver has an input for receiving a first transmit data signal, an output, a positive power supply terminal for receiving an input/output (I/O) power supply voltage, and a negative terminal for receiving an I/O ground voltage. The second driver has an input for receiving the I/O power supply voltage, an output, and a positive power supply terminal for receiving the I/O power supply voltage. The reception circuit is coupled to the output of the first driver and said output of the second driver, wherein the reception circuit forms a reference voltage based an average of signal content below a predetermined frequency of the output of the second driver, and receives a signal from the output of the first driver using the reference voltage.

In yet another form, a data transmission system includes a reference voltage driving circuit, a first reference voltage forming circuit, and a first buffer. The reference voltage driving circuit includes a first resistor having a first terminal coupled to an input/output (I/O) power supply voltage, and second terminal for coupling to a first end of a first transmission line, and a second resistor having a first terminal for coupling to a first end of a second transmission line, and a second terminal coupled to an I/O ground. The first reference voltage forming circuit coupled to a second end of said first transmission line and a second end of said second transmission line, for forming a first reference voltage based an average of signal content below a predetermined frequency of signals at said second ends of said first and second transmission lines. The first buffer for receiving a first input signal based on said reference voltage.

Figure 1:
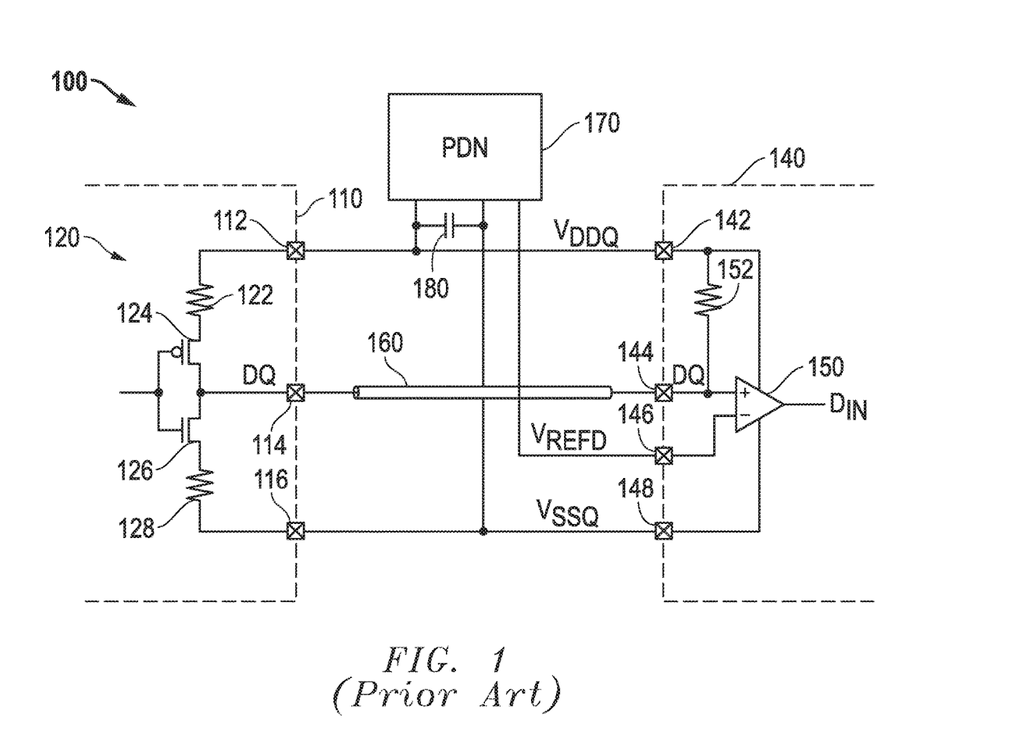
FIG. 1 illustrates in partial block diagram and partial schematic form a data transmission system known in the prior art.

FIG. 1 illustrates in partial block diagram and partial schematic form a data transmission system 100 known in the prior art. Data transmission system 100 includes generally a transmission circuit 110, a reception circuit 140, a transmission line 160, a power distribution network 170 labeled "PDN", and a capacitor 180. Transmission circuit 110 includes a terminal 112 for receiving an input/output (I/O) power supply voltage labeled "$V_{DDQ}$", a terminal 114 for providing a data output signal labeled "DQ", a terminal 116 for receiving an I/O ground voltage labeled "$V_{SSQ}$", and a driver 120. Driver 120 includes a resistor 122, a P-channel MOS transistor 124, an N-channel MOS transistor 126, and a resistor 128. Resistor 122 has a first terminal connected to terminal 112, and a second terminal. Transistor 124 has a source connected to the second terminal of resistor 122, a gate, and a drain connected to terminal 114. Transistor 126 has a drain connected to the drain of transistor 124, a gate connected to the gate of transistor 124, and a source connected to terminal 116.

Reception circuit 140 includes a terminal 142 for receiving $V_{DDQ}$, a terminal 144 for receiving signal DQ, a terminal 146 for receiving a reference voltage labeled "$V_{REFD}$", a terminal 148 for receiving $V_{SSQ}$, a comparator 150, and a resistor 152. Comparator 150 has a non-inverting input connected to terminal 144, an inverting input connected to terminal 146, an output for providing a data input signal labeled "$D_{IN}$", a positive power supply voltage terminal connected to terminal 142, and a negative power supply terminal connected to terminal 146. Resistor 152 has a first terminal connected to terminal 142, and a second terminal connected to terminal 144.

Transmission line 160 has a first end connected to terminal 114 of transmission circuit 110, and a second end connected to terminal 144 of reception circuit 140.

Power distribution network 170 has an output for providing $V_{DDQ}$, an output for providing I/O ground, and an output for providing reference voltage $V_{REFD}$. Capacitor 180 has a first terminal for receiving $V_{DDQ}$, and a second terminal for receiving $V_{SSQ}$.

In one example, reception circuit 140 is a double data rate (DDR) memory chip and transmission circuit 110 is a system-on-chip (SOC) that has an interface to the memory chip over conductors on a printed circuit board. Driver 120 in transmission circuit 110 is a push-pull driver that has a characteristic impedance set by resistor 122 when driver 120 drives a high voltage and by resistor 128 when driver 120 drives a low voltage. Reception circuit 140 senses the voltage at the second end of transmission line 160 using comparator 150 and resistor 152, which serves as a termination to transmission line 160. Comparator 150 compares the voltage on terminal 144 to reference voltage $V_{REFD}$ received on terminal 146 and provides signal $D_{IN}$ in response. Reference voltage $V_{REFD}$ is approximately midway between $V_{DDQ}$ and $V_{SSQ}$.

Power distribution network 170 receives power from a voltage source such as a battery or AC mains through a switch mode power supply that provides power supply voltage $V_{DDQ}$ at a desired level with respect to $V_{SSQ}$. It also provides $V_{REFD}$ at approximately midway between $V_{DDQ}$ and $V_{SSQ}$. Capacitor 180 operates as a power supply decoupling capacitor and provides noise filtering and decoupling between $V_{DDQ}$ and $V_{SSQ}$.

Data transmission and reception operations are susceptible to noise injected into the power supply distribution network. Power supply voltage $V_{DDQ}$ at terminal 112 is different than $V_{DDQ}$ at terminal 142 due to the impedance of the conductor that distributes $V_{DDQ}$. Likewise, ground voltage $V_{SSQ}$ at terminal 116 is different than $V_{SSQ}$ at terminal 148 due to the impedance of the conductor that distributes $V_{SSQ}$. In certain environments, noise can be injected into the power supply distribution network that is so significant that the reception circuit can provide signal $D_{IN}$ in the wrong state.

Figure 2:
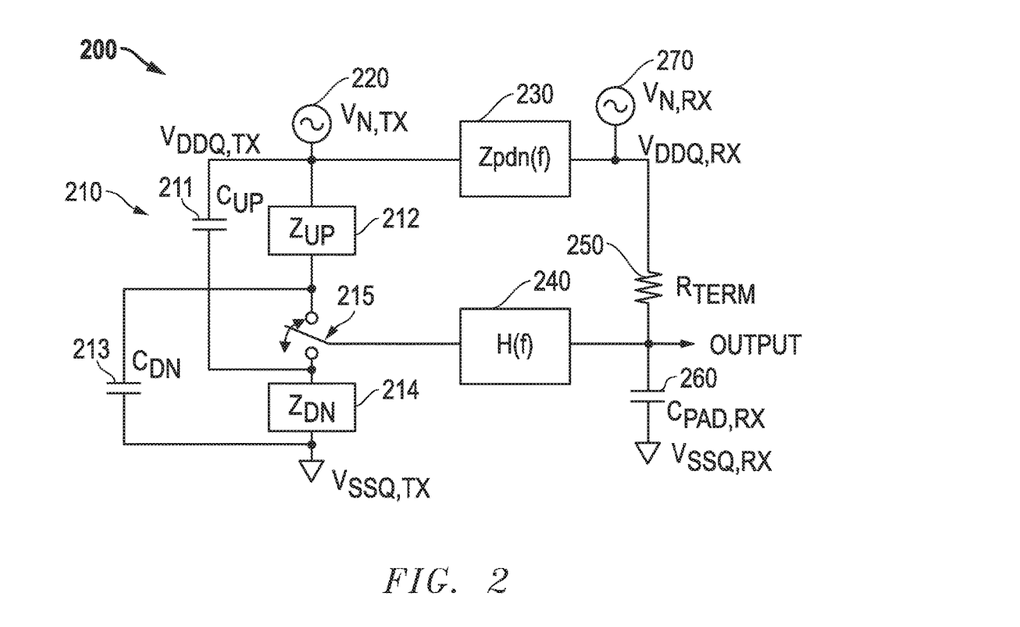
FIG. 2 illustrates in partial block diagram and partial schematic form an electrical model of the data transmission system of FIG. 1.

FIG. 2 illustrates in partial block diagram and partial schematic form an electrical model 200 of data transmission system 100 of FIG. 1. Electrical model 200 includes a transmission circuit 210, a transmission side power supply noise generator 220, a power distribution network transfer function operator 230, a signal transmission line transfer function operator 240, a termination resistance 250, a receive capacitor 260 labeled "$C_{PAD,RX}$", and a reception side power supply noise source 270.

Transmission circuit 210 includes a pullup capacitor 211 labeled "$C_{UP}$", a pullup impedance 212 labeled "$Z_{UP}$", a pulldown capacitor 213 labeled "$C_{DN}$", a pulldown impedance labeled "$Z_{DN}$", and a switch 215. Capacitor 211 has a first terminal connected to a transmission side power supply node labeled "$V_{DD,TX}$", and a second terminal. Pullup impedance 212 has a first terminal connected to transmission side power supply node $V_{DD,TX}$, and a second terminal. Pulldown capacitor 213 has a first terminal connected to the second terminal of pullup impedance 212, and a second terminal connected to a transmit side ground terminal labeled "$V_{SS,TX}$". Pulldown impedance 214 has a first terminal connected to the second terminal of pullup capacitor 211, and a second terminal connected to transmit side ground terminal $V_{SS,TX}$. Switch 215 has a first pole connected to the second terminal of pullup impedance 212 and to the first terminal of pulldown capacitor 213, a second pole connected the second terminal of pullup capacitor 211 and to the first terminal of pulldown impedance 214, and an output terminal that is switched between the first and second poles in response to a data signal.

Transmission side power supply noise generator 220 has an output terminal connected to transmission side power supply terminal $V_{DD,TX}$. Power distribution network transfer function operator 230 has a first terminal connected to transmission side power supply terminal $V_{DD,TX}$, and a second terminal, and has an associated transfer function labeled "Zpdn(f)". Signal transmission line transfer function operator 240 has an first terminal connected to the output terminal of switch 215, a second terminal for providing a signal labeled "OUTPUT", and has an associated transfer function similarly labeled "H(f)". It should be apparent that there may be slight differences between the transfer functions of transfer function operator 230 and transfer function operator 240, but for simplicity these are shown as being the same.

Termination resistor 250 has a first terminal connected to a reception side power supply node labeled "$V_{DD,RX}$", and a second terminal connected to the output of transfer function operator 240. Termination capacitance 260 has a first terminal connected to the output of transfer function operator 240, and a second terminal connected to a receive side ground terminal labeled "$V_{SS,RX}$". Reception side power supply noise generator 270 has an output terminal connected to reception side power supply terminal $V_{DD,RX}$.

Electrical model 200 is useful in understanding the effects of power supply noise on signal integrity and data eye closure. Switch 215 is connected to the first pole when transmission circuit 210 drives a logic high voltage. In this case, the logic high voltage is driven through pullup impedance 212 while pulldown capacitor 213 is present between the second terminal of pullup impedance 212 and transmission ground $V_{SS,TX}$. Pullup capacitor 211 and pulldown impedance 214 are not connected to the transmission line. In this case, noise generator 220 couples noise through pullup impedance 212, switch 215, and transfer function operator 240 that is reflected in the OUTPUT signal.

Switch 215 is connected to the second pole when transmission circuit 210 drives a logic low voltage. In this case, the logic low voltage is driven through pulldown impedance 214 while pullup capacitor 211 is present between the first terminal of pulldown impedance 214 and transmission power supply terminal $V_{DD,TX}$. Pullup impedance 212 and pulldown capacitor 213 are not connected to the transmission line. In this case, noise source 270 is coupled noise through termination resistance 250, transfer function operator 240, and switch 215, and a portion of the receive side noise is injected into the OUTPUT signal.

Electrical model 200 also illustrates the frequencies of noise signal content that will be reflected in the OUTPUT signal. When transmission circuit 210 drives a logic high voltage, pulldown capacitor 213 shunts high-frequency noise content to transmission side ground $V_{SSQ,TX}$. Likewise signal transmission line transfer function operator 240 has a lowpass characteristic and filters lower frequency noise content. When transmission circuit 210 drives a logic low voltage, receive capacitor 260 shunts high-frequency noise content received from either noise generator 220 through pullup capacitor 211 and transfer function operator 240, or from noise source 270, to reception side ground $V_{SSQ,RX}$. Thus in either case, electrical model 200 predicts that low frequency noise content will be reflected more in the received signal OUTPUT than high frequency content. The inventors have confirmed this frequency dependence by circuit simulation.

Figure 3:
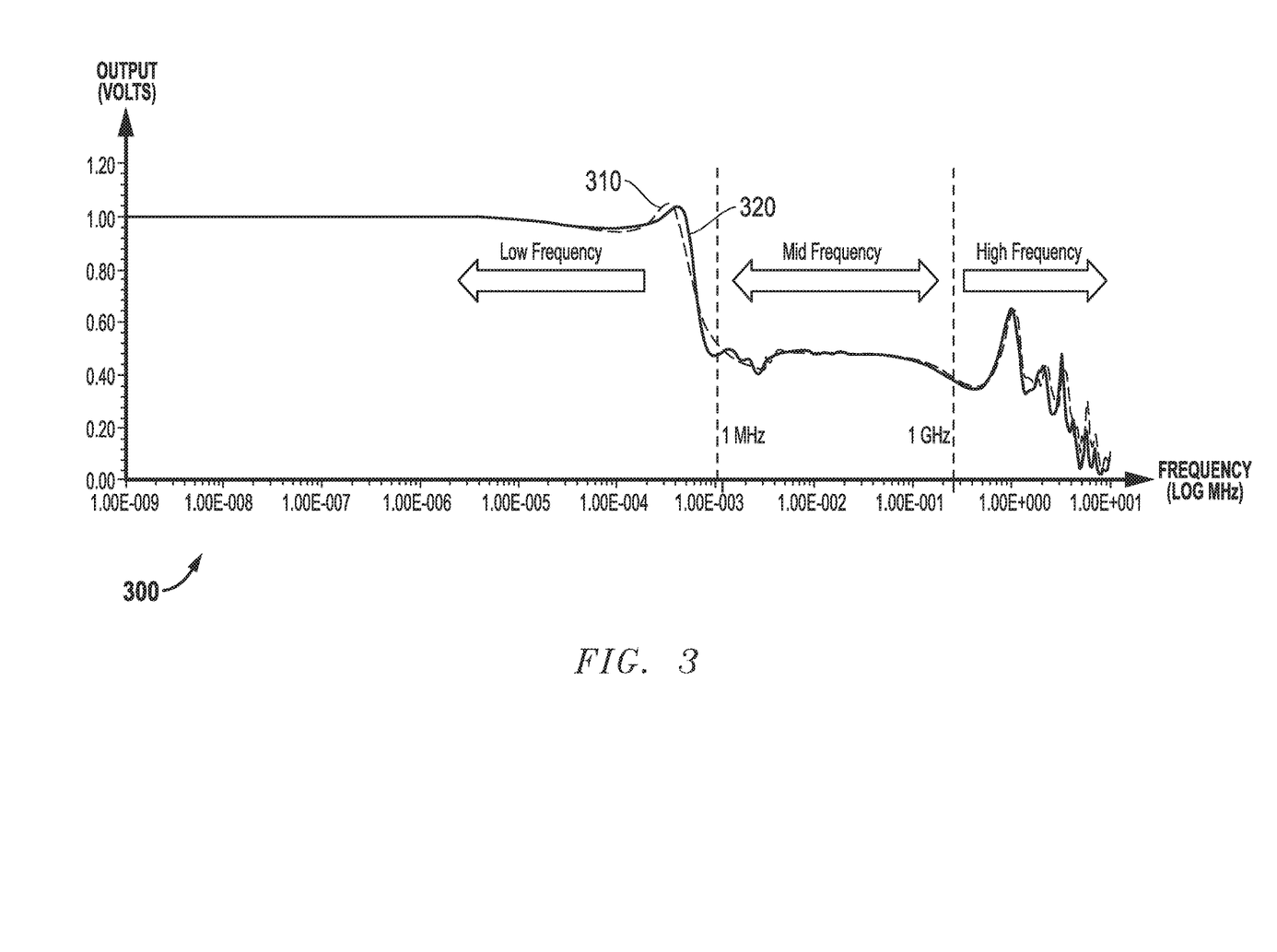
FIG. 3 illustrates a graph of the power supply noise spectrum of the data transmission system of FIG. 1.

FIG. 3 illustrates a graph 300 of the power supply noise spectrum of data transmission system 100 of FIG. 1. In graph 300, the horizontal axis represents a logarithm of frequency in megahertz (log MHz), and the vertical axis represents the output in volts. Graph 300 was obtained by analyzing the frequency response of a 1-volt sinusoidal AC voltage injected by noise voltage source 280 onto $V_{DD,TX}$. A curve 310 represents the frequency response of a first terminal of a set of terminals, and a curve 320 represents the frequency response of a second terminal of the set of terminals. As shown in graph 300, the frequency response characteristic naturally separates into a low frequency region below about 1 megahertz (MHz), a mid frequency region between about 1 MHz and 1 GHz, and a high frequency region above about 1 GHz. As curves 310 and 320 show, in the low frequency region the transfer function is dominated by the power plane path, whereas the mid- and high-frequency regions are dominated by the response of the channel, and the channel itself provides significant noise filtering. The inventors discovered that if the power supply noise components could be significantly reduced in the low-frequency region, the effect of power supply noise could be greatly reduced.

Figure 4:
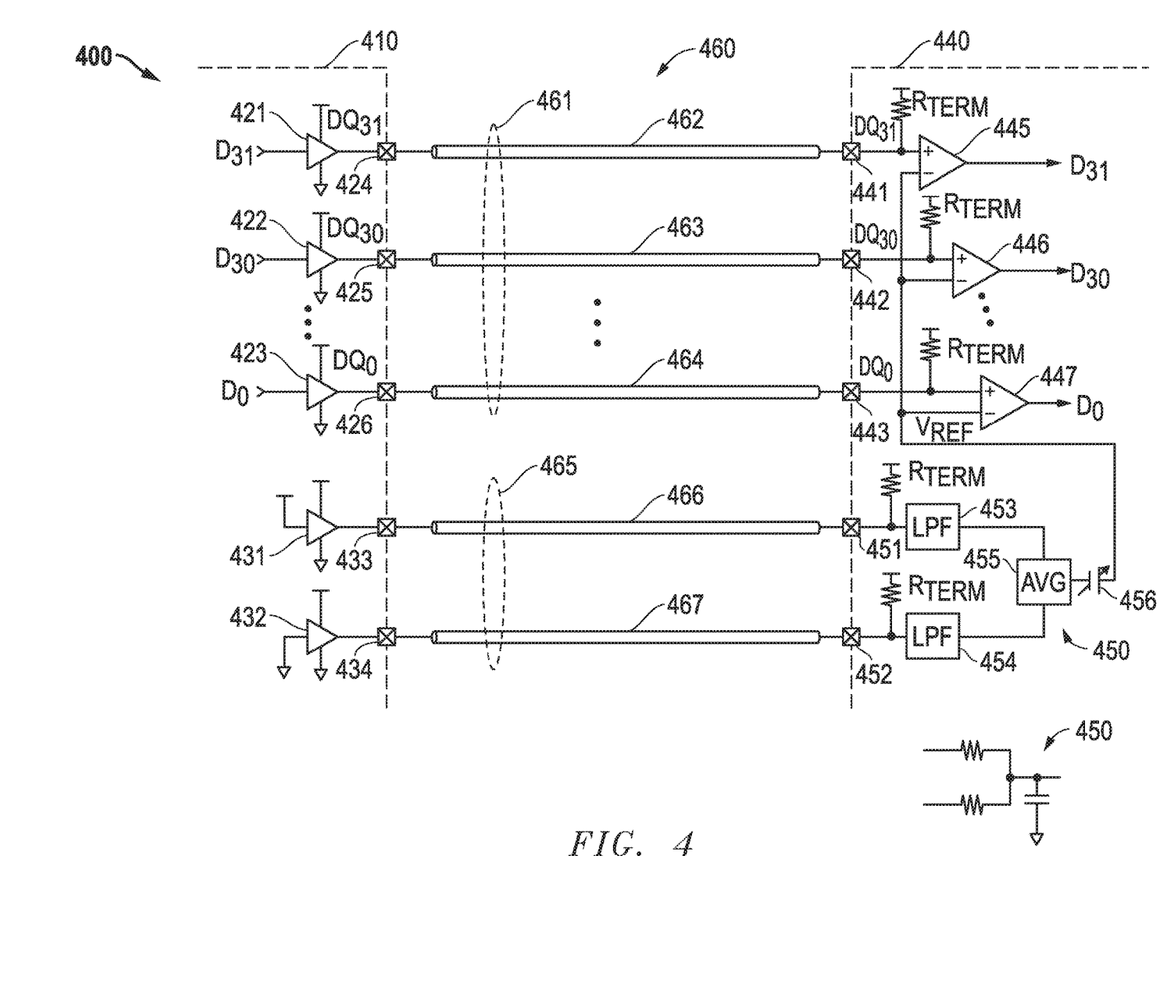
FIG. 4 illustrates in partial block diagram and partial schematic form a data transmission system according to some embodiments.

FIG. 4 illustrates in partial block diagram and partial schematic form a data transmission system 400 according to some embodiments. Data transmission system 400 includes generally a transmission circuit 410, a reception circuit 440, and a set of transmission lines 460. Transmission circuit 410 includes a set of drivers for driving signals onto a 32-bit data bus including a set of representative drivers 421, 422, and 423 connected to integrated circuit terminals 424, 425, and 426 for conducting data signals labeled "$DQ_{31}$", "$DQ_{30}$", and "$DQ_0$", respectively. Driver 421 has an input terminal for receiving a data signal labeled "$D_{31}$", an output connected to integrated circuit terminal 424, a positive power supply terminal for receiving I/O power supply voltage $V_{DDQ}$, and a negative power supply terminal connected to I/O ground. Driver 422 has an input terminal for receiving a data signal labeled "$D_{30}$", an output connected to integrated circuit terminal 424, a positive power supply terminal for receiving I/O power supply voltage $V_{DDQ}$, and a negative power supply terminal connected to I/O ground. Transmission circuit 410 also includes a pair of additional drivers including drivers 431 and 432 for conducting a true write clock signal labeled "$W_{CK}$" and a complementary write clock signal labeled "$\overline{WCLK}$" onto integrated circuit terminals 433 and 434, respectively. Driver 431 has an input connected to $V_{DDQ}$, an output connected to an integrated circuit terminal 433, a positive power supply terminal for receiving I/O power supply voltage $V_{DDQ}$, and a negative power supply terminal connected to I/O ground. Driver 432 has an input connected to I/O ground, an output connected to a integrated circuit terminal 433, a positive power supply terminal for receiving I/O power supply voltage $V_{DDQ}$, and a negative power supply terminal connected to I/O ground.

Reception circuit 440 includes a set of integrated circuit terminals 441-443 for conducting signals $DQ_{31}$, $DQ_{30}$, and $DQ_0$, respectively, a set of receivers including receivers 445, 446, and 447, a set of additional integrated circuit terminals 451 and 452, and a reference voltage forming circuit 450. Receiver 445 has a non-inverting input connected to integrated circuit terminal 441 and through a termination resistor to $V_{DDQ}$, an inverting input for receiving a reference voltage labeled "$V_{REF}$", and an output for providing data signal $D_{31}$. Receiver 446 has a non-inverting input connected to integrated circuit terminal 442 and through a termination resistor to $V_{DDQ}$, an inverting input for receiving $V_{REF}$, and an output for providing data signal $D_{30}$. Receiver 447 has a non-inverting input connected to integrated circuit terminal 443 and through a termination resistor to $V_{DDQ}$, an inverting input for receiving $V_{REF}$, and an output for providing data signal $D_0$.

Reference voltage forming circuit 450 includes lowpass filters 453 and 454, an averager 455, and a variable voltage source 456. Lowpass filter 453 has an input connected to integrated circuit terminal 451 and through a termination resistor to $V_{DDQ}$, and an output. Lowpass filter 454 has an input connected to integrated circuit terminal 452 and through a termination resistor to $V_{DDQ}$, and an output. Averager 455 has a first input connected to the output of lowpass filter 453, a second input connected to the output of lowpass filter 454, and an output. Variable voltage source 456 has an input connected to the output of averager 455, a control input for receiving a control signal labeled "$V_{OS}$", and an output for providing reference voltage $V_{REF}$.

Transmission lines 460 include a first set of transmission lines 461 including individual transmission lines 462-464, and a second set of transmission lines 465 including individual transmission lines 466 and 467. Each transmission line has a first end connected to a corresponding integrated circuit terminal in transmission circuit 410, and a second connected to a corresponding integrated circuit terminal in reception circuit 440.

In the exemplary data transmission system shown in FIG. 4, reception circuit 420 is an integrated circuit memory, in particular a graphics double data rate, version five (GDDR5) memory, and transmission circuit 410 is an SOC with a graphics processing unit (GPU) and with a DDR memory interface. The two chips communicate over a 32-bit data bus conducting signals $DQ_{31}$-$DQ_0$. They are both mounted on a printed circuit board and transmission lines 460 are printed circuit board traces that are modeled as transmission lines. Because of the high speed of data transmission, for example several gigahertz (GHz), receivers 445 detect small voltage swings around $V_{REF}$, defining an "eye". To ensure good reception in the presence of noise, $V_{REF}$ should be in the middle of the "eye". However the injection of power supply noise through the power distribution network can move the "eye" with respect to a fixed value of $V_{REF}$ so much that reception circuit 440 sometimes incorrectly receives the data.

In order to overcome this problem, the inventors have developed a system which adjusts $V_{REF}$ according to the injected noise to compensate for power supply noise so that the effect of the power supply noise injected through the power distribution network is greatly reduced or eliminated. In particular the reference voltage used in reception circuit 440 is obtained from two signals that are not used during transmission of data. Thus in FIG. 4 buffer 431 has an input connected to $V_{DDQ}$ while buffer 432 has an input connected to I/O ground.

Reference voltage forming circuit 450 includes two lowpass filters 453 and 454 to filter output high frequency noise components, as well as averager 455 to form the average of the two levels. Thus $V_{REF}$ adjusts according to the noise in the low frequency region that the channel does a poor job in filtering out.

Note that the average or "DC" level can be slightly different from $(V_{DDQ}-V_{SSQ})/2$. This difference may occur, for example, if the write clock signals do not have a precise 50% duty cycle. In this case, reference voltage forming circuit 450 uses a variable voltage source 456 to correct for this imbalance by adding or subtracting a small reference voltage $V_{OS}$ to or from the average to form $V_{REF}$. Existing DDR memories provide for the adjustment of this offset voltage in mode register settings which are set during training.

In one embodiment shown in more detail in FIG. 4, voltage forming circuit 450 is implemented simply using only two resistors and one capacitor. The two resistors receive the high and low levels at the second end of their respective transmission lines and form an average value through a wire-OR connection. In addition reference voltage forming circuit 450 forms the lowpass filters using a capacitor to ground that operates alternately with each resistor to form a lowpass filter with a desired cutoff frequency. In this example, the desired cutoff frequency for the lowpass filters will be set above 1 MHz to pass the low frequency noise that is not attenuated significantly in the transmission lines. However the chosen cutoff frequency may be set much higher and will be limited only by the tracking capability of the particular system as will be described further below. Note that the configuration for the lowpass filters and averager is just one possible implementation, and higher-order filters can be implemented as well.

In the example embodiment in FIG. 4, the DDR memory chip includes the reference voltage forming circuit 450 on-chip. However it is also possible to move this circuit off chip and use an off-chip reference voltage forming circuit to drive the $V_{REF}$ pin without the need to change the design of the DDR memory chip. As shown in FIG. 4, a single variable voltage source 456 is used to provide a DC offset for all of a set of receivers, but in other embodiments each receiver can have its own corresponding variable voltage source to provide per-bit tuning.

In various embodiments different signals that are unused during a write cycle can be used to develop $V_{REF}$. Also FIG. 4 shows the transmission of data in one direction, but in the exemplary system data will also be transmitted in the opposite direction. These additional considerations are addressed in exemplary embodiments presented below.

Figure 5:
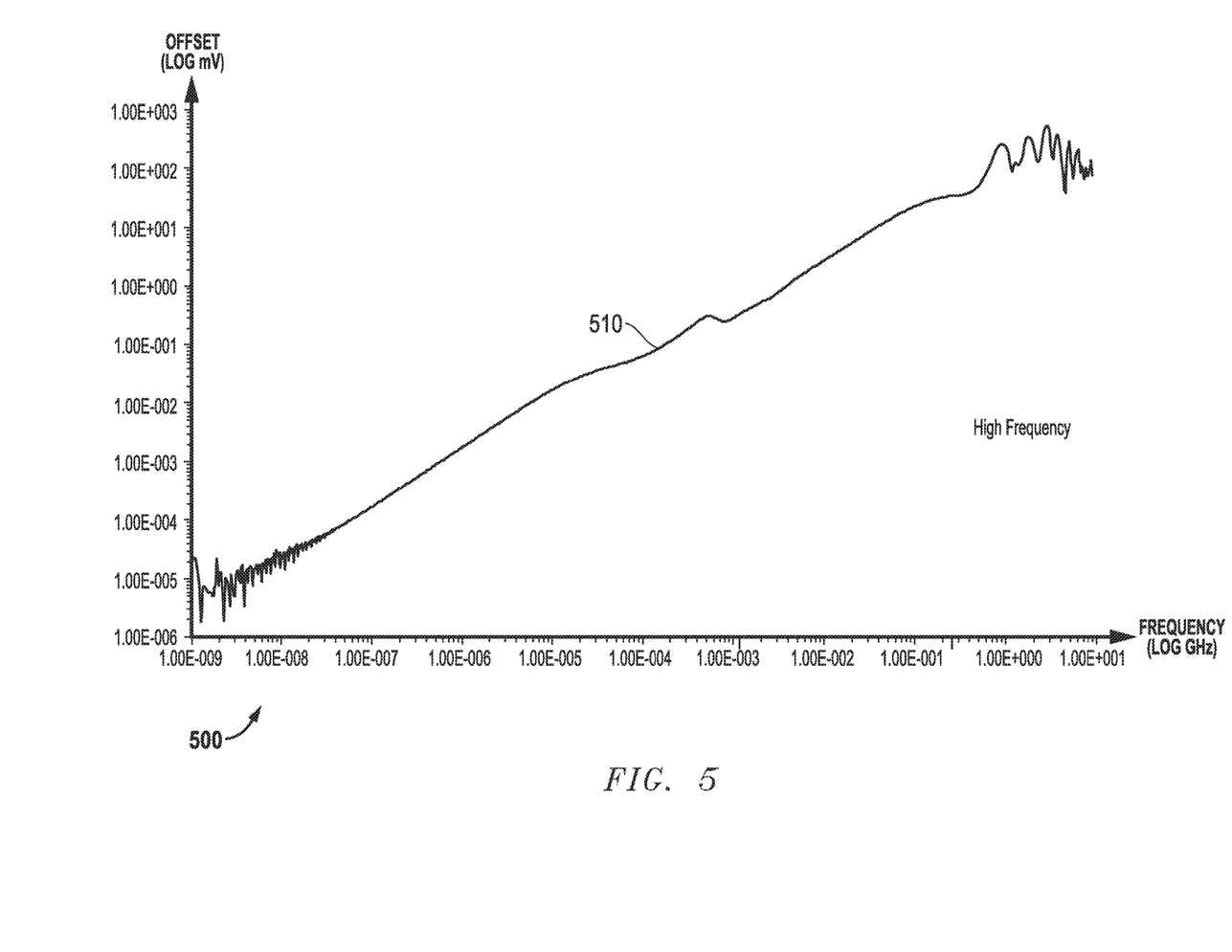
FIG. 5 illustrates a graph of the noise tracking among a pair of signal lines of the data transmission system of FIG. 4.

FIG. 5 illustrates a graph 500 of the noise tracking among a pair of signal lines of data transmission system 400 of FIG. 4. In graph 500, the horizontal axis represents a logarithm of frequency in gigahertz (log GHz), and the vertical axis represents the difference in received noise signals between two data pins in millivolts (mV) when a 1 V AC signal that represents a normalized supply noise source at each frequency is applied at $V_{DDQ,TX}$. Waveform 510 shows the offset in frequency response versus frequency between two signals lines, in this case $DQ_{31}$ and $DQ_{28}$, that were routed similarly on the printed circuit board. As shown in FIG. 5, the offset is a weak linear function of frequency but shows that the two signal lines have very similar noise transfer characteristics and the two signals track each other very well all the way down to very low frequency ranges. Thus is it possible to measure $V_{REF}$ for all the data signals having similar printed circuit board routing. In this example because of the good tracking up to almost 800 MHz, it is possible to set the cutoff frequency of the lowpass filters to be about 300 MHz.

Figure 6:
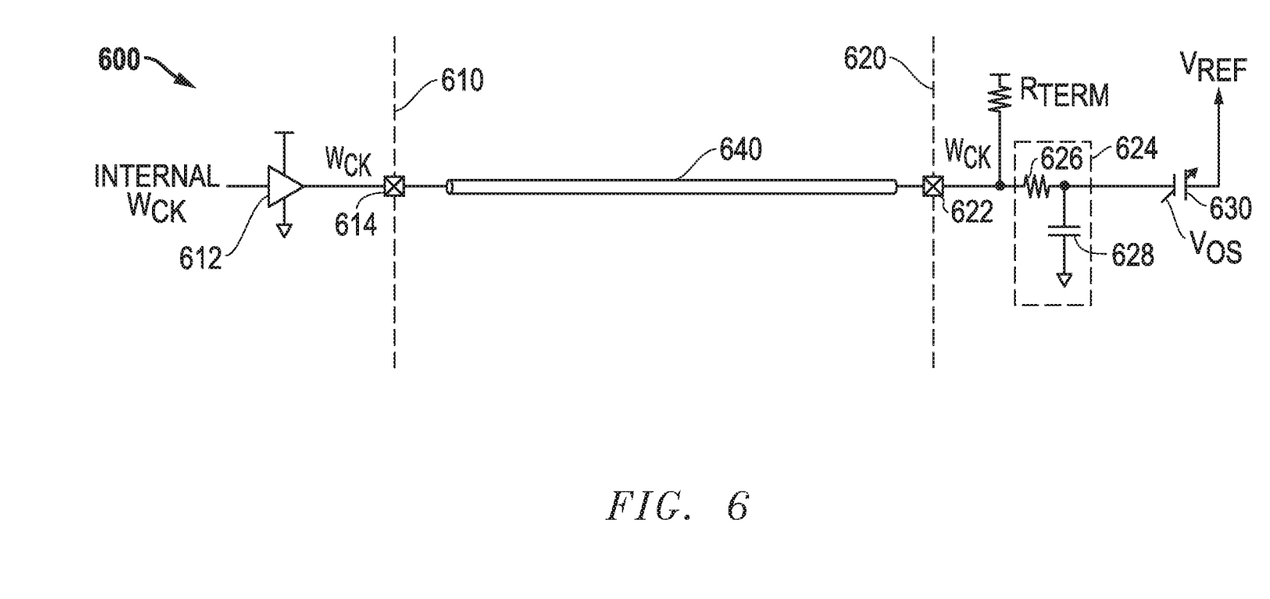
FIG. 6 illustrates in partial block diagram and partial schematic form another data transmission system according to some embodiments.

FIG. 6 illustrates in partial block diagram and partial schematic form another data transmission system 600 according to some embodiments. Data transmission system 600 includes a transmission circuit 610, a reception circuit 620, and a transmission line 640. Transmission circuit 610 uses a single driver 612 having an input for receiving an internal write clock ($W_{CK}$) signal, and an output for providing the $W_{CK}$ signal to an integrated circuit terminal 614, a positive power supply voltage terminal connected to $V_{DDQ}$, and a negative power supply voltage terminal connected to I/O ground. Reception circuit 620 includes an integrated circuit terminal 622 for receiving the $W_{CK}$ signal, a lowpass filter 624, and a variable voltage source 630. Lowpass filter 624 has an input connected to integrated circuit terminal 622 and to $V_{DDQ}$ through a termination resistor, and an output. Variable voltage source 630 has an input connected to the output of lowpass filter 624, a control input for receiving $V_{OS}$, and an output for providing reference voltage $V_{REF}$. Lowpass filter 624 includes a resistor 626 and a capacitor 628. Resistor 626 has a first terminal forming the input of lowpass filter 624, and a second terminal forming the output of lowpass filter 624. Capacitor 628 has a first terminal connected to the second terminal of resistor 626, and a second terminal connected to ground. Transmission line 640 has a first end connected to integrated circuit terminal 614 in transmission circuit 610, and a second end connected to integrated circuit terminal 622 in reception circuit 620.

Reception circuit 620 takes advantage of the fact that the $W_{CK}$ signal switches at a high frequency with approximately 50% duty cycle. The switching frequency, for example several GHz, is significantly higher than the cutoff frequency of lowpass filter 624 and lowpass filter 624 averages the high and low levels of the $W_{CK}$ signal and passes the low-frequency power distribution network noise components. As noted above, any variation from an ideal 50% duty cycle appears as a DC offset to $V_{REF}$, and variable voltage source 630 provides a variable offset that can be used to correct for this duty cycle variation. Note that lowpass filter 624 is shown as a simple first-order filter, but when $W_{CK}$ is relatively high, for example 8 GHz, a higher-order filter may be required.

Figure 7:
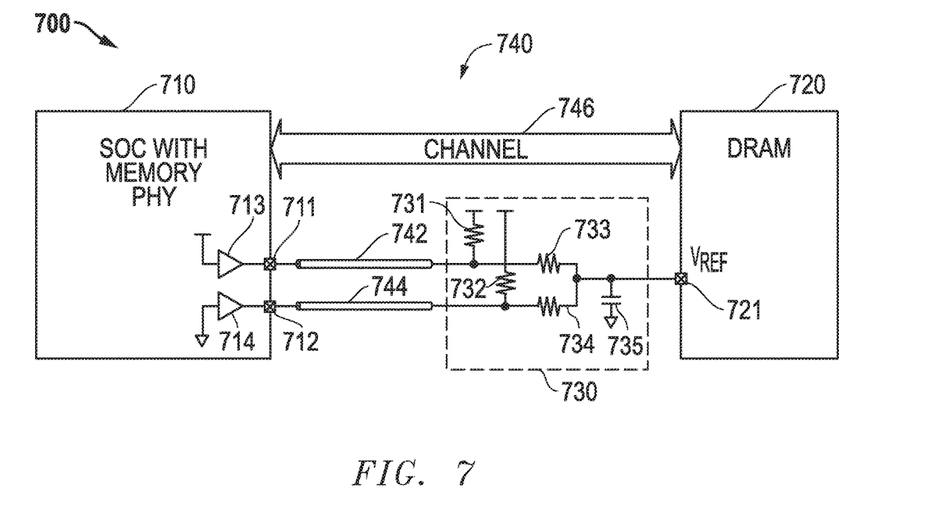
FIG. 7 illustrates in partial block diagram and partial schematic form yet another data transmission system according to some embodiments.

FIG. 7 illustrates in partial block diagram and partial schematic form yet another data transmission system 700 according to some embodiments. Data transmission system 700 includes a transmission circuit 710, a reception circuit 720, a reference voltage forming circuit 730, and a set of transmission lines 740. Transmission circuit 710 includes integrated circuit terminals 711 and 712 and buffers 713 and 714. Driver 713 has an input connected to $V_{DDQ}$, an output connected to integrated circuit terminal 711, a positive power supply terminal for receiving $V_{DDQ}$, and a negative power supply terminal connected to I/O ground. Driver 714 has an input connected to I/O ground, an output connected to an integrated circuit terminal 712, a positive power supply terminal for receiving $V_{DDQ}$, and a negative power supply terminal connected to I/O ground. Data transmission circuit 710 also has a set of integrated circuit terminals, not shown in FIG. 7, which conduct data signals of a data path.

Reception circuit 720 has an integrated circuit terminal 712 for receiving voltage $V_{REF}$, and a set of integrated circuit terminals, not shown in FIG. 7, which conduct signals that form a data path.

Reference voltage forming circuit 730 includes resistors 731-734 and a capacitor 735. Resistor 731 has a first terminal connected to $V_{DDQ}$, and a second terminal. Resistor 732 has a first terminal connected to $V_{DDQ}$, and a second terminal. Resistor 733 has a first terminal connected to the second terminal of resistor 731, and a second terminal connected to integrated circuit terminal 721. Resistor 734 has a first terminal connected to the second terminal of resistor 732, and a second terminal connected to integrated circuit terminal 721. Capacitor 735 has a first terminal connected to the second terminals of resistors 733 and 734 and to integrated circuit terminal 721, and a second terminal connected to I/O ground.

Transmission lines 740 include individual transmission lines 742 and 744, and a set of data transmission lines shown generally as a channel 746.

Data transmission system 700 shows that reference voltage forming circuit 730 can be implemented with discrete, off-chip circuit components and can drive the $V_{REF}$ terminal of standard memory devices currently available from any of a variety of manufacturers. In this regard it is important to implement reference voltage forming circuit 730 adjacent to reception circuit 720 to reduce any offsets from mismatched printed circuit board routing. Better noise compensation can be achieved if reference voltage forming circuit 730 is on-chip inside DRAM 720. However data transmission system 700 is a compromise solution when reference voltage forming circuit 730 cannot be placed on-chip, for example when data transmission system 700 is built with pre-existing DRAMs.

Figure 8:
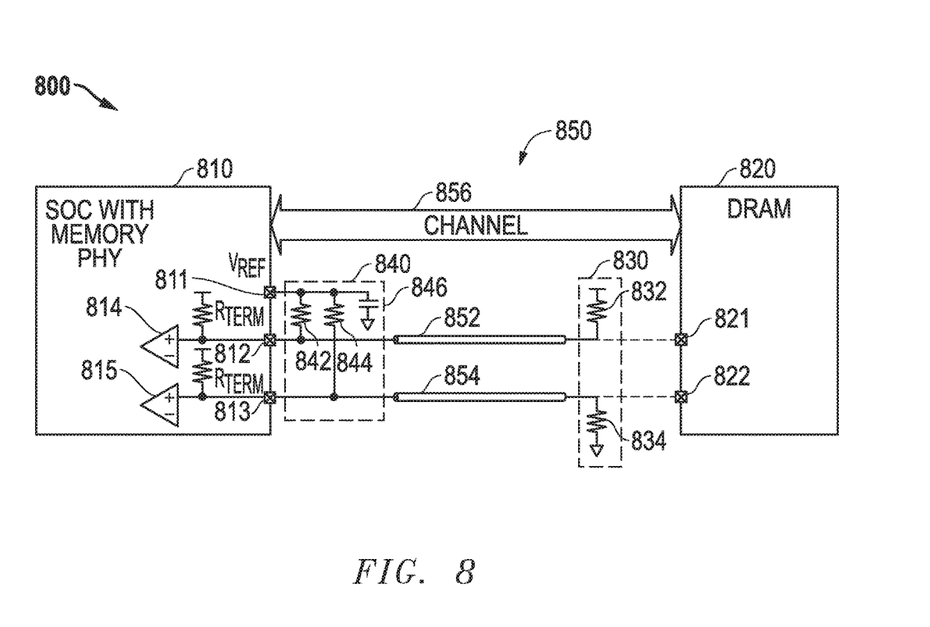
FIG. 8 illustrates in partial block diagram and partial schematic form still another data transmission system according to some embodiments.

FIG. 8 illustrates in partial block diagram and partial schematic form still another data transmission system 800 according to some embodiments. Data transmission system 800 includes a reception circuit 810, a transmission circuit 820, a reference voltage driving circuit 830, a reference voltage forming circuit 840, and a set of transmission lines 850. Reception circuit 810 includes integrated circuit terminals 811, 812, and 813 and receivers 814 and 815. Receiver 814 has a non-inverting input connected to integrated circuit terminal 812 and through a termination resistor to $V_{DDQ}$, an inverting input for receiving $V_{REF}$, and an output. Receiver 814 has a non-inverting input connected to integrated circuit terminal 812 and through a termination resistor to $V_{DDQ}$. Receiver 815 has a non-inverting input connected to integrated circuit terminal 812 and through a termination resistor to $V_{DDQ}$. Reception circuit 810 also has a set of integrated circuit terminals, not shown in FIG. 7, which conduct data signals of a data path.

Transmission circuit 820 has integrated circuit terminals 821 and 822, and a set of integrated circuit terminals, not shown in FIG. 8, which conduct signals that form a data path.

Reference voltage driving circuit 830 includes resistors 832 and 834. Resistor 832 has a first terminal for receiving $V_{DDQ}$, and a second terminal. Resistor 834 has a first terminal, and a second terminal connected to I/O ground.

Reference voltage forming circuit 840 includes resistors 842 and 844 and a capacitor 846. Resistor 842 has a first terminal connected to integrated circuit terminal 811, and a second terminal connected to integrated circuit terminal 812. Resistor 844 has a first terminal connected to integrated circuit terminal 811, and a second terminal connected to integrated circuit terminal 813. Capacitor 846 has a first terminal connected to the second terminals of resistors 842 and 844 and to integrated circuit terminal 811, and a second terminal connected to I/O ground.

Transmission lines 850 include individual transmission lines 852 and 854, and a set of data transmission lines shown generally as a channel 856. Transmission line 852 has a first end connected to integrated circuit terminal 812, and a second end connected to resistor 832. Transmission line 854 has a first end connected to integrated circuit terminal 813, and a second end connected to resistor 832.

Data transmission system 800 provides an additional mechanism for forming a reference voltage for data transmission in the opposite direction as that shown in FIGS. 4 and 6 above. In this example, reception circuit 810 is an SOC with a memory PHY and corresponds to transmission circuit 410 of FIG. 4 and 710 of FIG. 7. Similarly transmission circuit 820 is a DDR DRAM and corresponds to reception circuit 440 of FIG. 4 and 720 of FIG. 7. Reception circuit 810 uses two dummy receivers 814 and 815 with corresponding termination resistors to simulate the impedance seen at the ends of the actual transmission lines used to receive data. Data transmission system 800 assumes that transmission circuit 820 is a standard off-the-shelf memory that has not been modified, and so implements reference voltage driving circuit 830 as a separate circuit on the printed circuit board. It is placed in close proximity to transmission circuit 820 so that the transmission line parasitics mirror those of the data in channel 856. Reference voltage forming circuit 840 again uses two lowpass filters and an averager implemented with two resistors and two capacitors to form a reference voltage used to receive the data conducted through channel 856. Like data transmission systems 400 and 700, reception circuit 810 may also use an internal variable voltage source to eliminate an offset voltage. Better noise compensation can be achieved if reference voltage driving circuit 830 is on-chip inside DRAM 820 and reference voltage forming circuit 840 is on-chip inside SOC 810. However it may be more feasible to move reference voltage forming circuit 840 on-chip than to move reference voltage driving circuit 830 on-chip since transmission circuit 820 is a DRAM specified according to a standard whereas reception circuit 810 is an application-specific SOC. Thus as illustrated data transmission system 800 is a compromise solution when it is not feasible to place either circuit on-chip.

Figure 9:
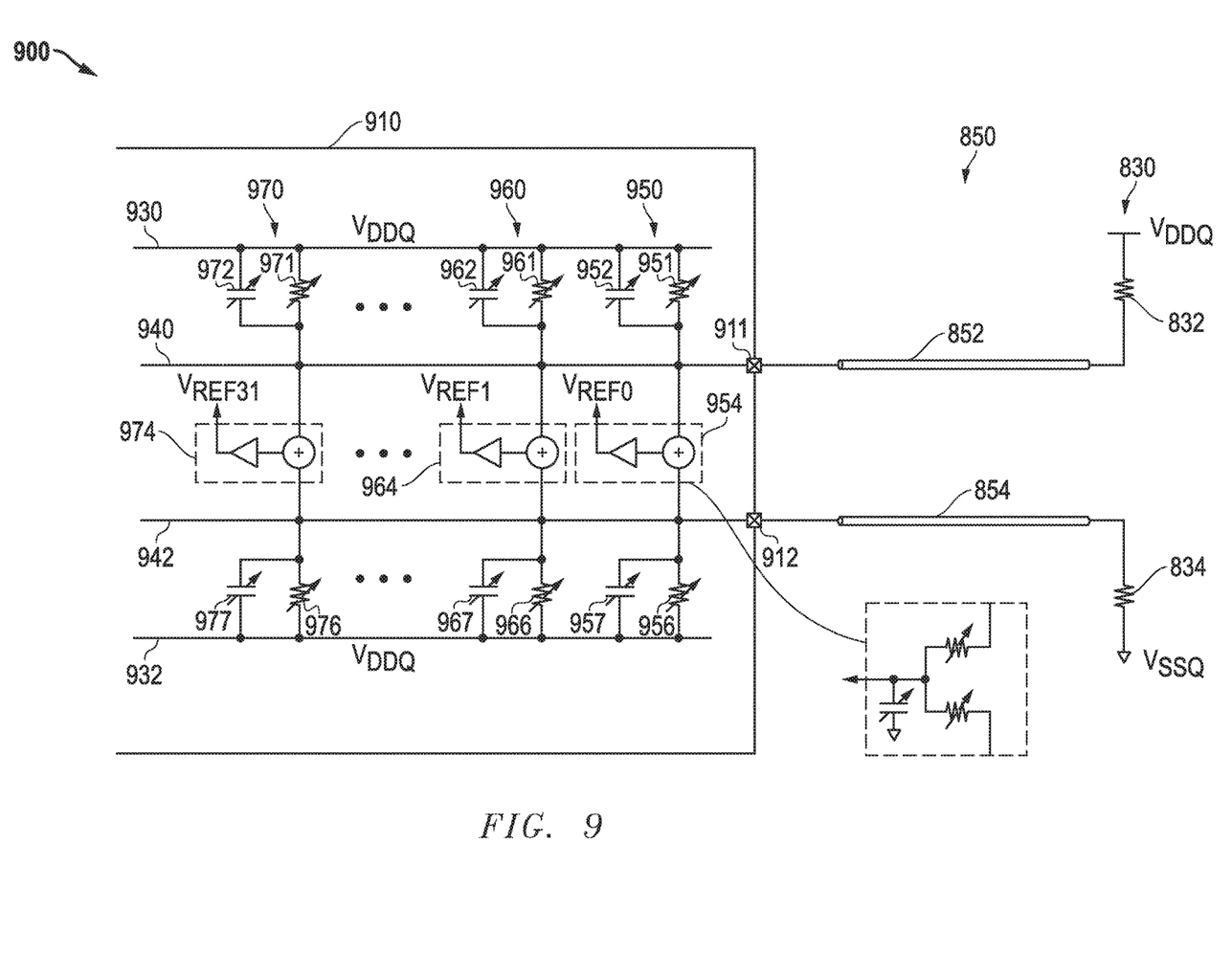
FIG. 9 illustrates in partial block diagram and partial schematic form still another data transmission system according to some embodiments.

FIG. 9 illustrates in partial block diagram and partial schematic form still another data transmission system 900 according to some embodiments. Data transmission system 900 includes a reception circuit 910, and reference voltage driving circuit 830 and transmission lines 850 as described with respect to FIG. 8 above.

Reception circuit 810 includes integrated circuit terminals 911 and 912 connected to internal buses 940 and 942, respectively. Bus 940 and 942 are distributed along a set of $V_{DDQ}$ buses 930 and $V_{SSQ}$ buses 932, respectively, and provide power to a physically distributed set of receivers such as receivers 445-447 as previously illustrated in FIG. 4. Corresponding to each receiver is a distributed termination and reference voltage forming circuit for each receiver.

Shown in FIG. 9 are three representative termination and reference voltage forming circuits 950, 960, and 970 corresponding to receivers for bits 0, 1, and 31 of a 32-bit bus. Termination and reference voltage forming circuit 950 includes a variable resistor 951, a variable capacitor 952, a reference voltage forming circuit 954, a variable resistor 956, and a variable capacitor 957. Variable resistor 951 has a first terminal connected to $V_{DDQ}$ bus 930, a second terminal connected to internal bus 940, and a control input. Variable capacitor 952 has a first terminal connected to $V_{DDQ}$ bus 930, a second terminal connected to internal bus 940, and a control input. Reference voltage forming circuit 954 has a first input connected to internal bus 940, a second input connected to internal bus 942, and an output terminal for providing reference voltage $V_{REF0}$ to a corresponding receiver. Variable resistor 956 has a first terminal connected to internal bus 942, a second terminal connected to $V_{DDQ}$ bus 932, and a control input. Variable capacitor 957 has a first terminal connected to internal bus 942, a second terminal connected to $V_{DDQ}$ bus 932, and a control input.

Termination and reference voltage forming circuits 960 and 970 are constructed the same as termination and reference voltage forming circuit 950 using correspondingly numbered circuit elements. Each reference voltage forming circuit can be formed with a simple first-order lowpass filter using two resistors and one capacitor as described in FIG. 4 above, or a higher-order filter.

In reception circuit 910, the resistors and capacitor are variable to allow precise tuning to compensate for manufacturing offsets. In addition, the resistors and capacitors in the decoupling networks are also variable so that they may be tuned as well.

In operation, the termination impedance seen looking input pins 911 and 912 from outside of reception circuit 910 is formed using a distributed network of impedances. The termination resistance and capacitance is determined as the parallel combination of a set of resistors and capacitors, respectively. Because the termination impedance is formed by a parallel combination of elements, each individual element need not be large to provide an overall impedance on the order of only 50-60 ohms.

Reception circuit 910 has a controller, not shown in FIG. 9, which performs a two-step calibration. In the first step, the controller performs a coarse tuning to bring the overall impedance to approximately 50-60 ohms. In the second step, the controller performs a fine tuning on the local resistors and capacitors to bring the impedance seen at any point to the desired amount.

Each reference voltage forming circuit operates as described with respect to FIG. 4 above. However since the reference voltage forming circuits are per-bit, they allow more precise compensation by reflecting power supply noise as they would be seen by the receivers at the physical location they are connected to $V_{DDQ}$ bus 930 and $V_{SSQ}$ bus 932. The result of this distributed, per-bit tuning system is to preserve the integrity of the data eye for very high transmission speeds, such as speeds in the several-GHz range.

The data transmission systems of FIGS. 4 and 6-8 or portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist includes a set of gates that also represent the functionality of the hardware comprising integrated circuits. The netlist is then placed and routed to produce a data set describing geometric shapes to be applied to masks. The masks are then used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, pre-existing integrated circuit terminals in the reception circuit that are not used to receive actual signals in the reception mode may be used to capture the power supply high and low levels. Alternatively a signal such as a write clock that has a duty cycle of about 50% can be used, relying on the difference between the lowpass filter cutoff frequency and the clock speed to average the high and low signal levels. The reception circuit can be modified to include the reference voltage forming circuit on-chip, or the reference voltage forming circuit can be implemented with discrete components on the printed circuit board. Also the reference voltage can be formed with any terminals having similar routing, and can be used for subsets of the data bus or for the whole bus.

Accordingly, it is intended by the appended claims to cover all modifications of the disclosed embodiments that fall within the scope of the disclosed embodiments.

What is claimed is:

1. A data transmission system comprising:
   a transmission circuit comprising:
      a first driver having an input for receiving a first transmit data signal, an output, a positive power supply terminal for receiving an input/output (I/O) power supply voltage, and a negative terminal for receiving an I/O ground voltage;
      a second driver having an input for receiving said I/O power supply voltage, an output, and a positive power supply terminal for receiving said I/O power supply voltage, wherein said transmission circuit does not use said second driver during transmission of data; and
      a third driver having an input for receiving said I/O ground voltage, an output, and a negative power supply terminal coupled to said I/O ground voltage, wherein said transmission circuit does not use said third driver during transmission of data, and
   a reception circuit coupled to said output of said first driver, said output of said second driver, and said output of said third driver, wherein said reception circuit forms a reference voltage based an average of signal content below a predetermined frequency of outputs of said second and third drivers, and receives a signal from said output of said first driver using said reference voltage.

2. The data transmission system of claim 1, wherein said reception circuit comprises:
   a first lowpass filter having an input coupled to said output of said second driver, and an output;
   a second lowpass filter having an input coupled to said output of said third driver, and an output; and
   an averager having a first input coupled to said output of said first lowpass filter, a second input coupled to said output of said output of said second lowpass filter, and an output for providing said reference voltage.

3. The data transmission system of claim 2, wherein said reception circuit is formed partially on an integrated circuit chip and said first lowpass filter, said second lowpass filter, and said averager are external to said integrated circuit chip.

4. The data transmission system of claim 2, wherein said first lowpass filter and said second lowpass filter each have a cutoff frequency above 100 megahertz (MHz).

5. The data transmission system of claim 2, wherein said reception circuit further comprises:
a variable voltage source having an input coupled to said output of said averager, and an output for providing said reference voltage.

6. The data transmission system of claim 5, wherein said reception circuit is formed on a single integrated circuit chip.

7. The data transmission system of claim 1, wherein:
said transmission circuit comprises a plurality of additional drivers each having an input for receiving a corresponding transmit data signal, an output coupled to a corresponding data terminal, a positive power supply terminal for receiving said I/O power supply voltage, and a negative terminal for receiving said I/O ground voltage; and
said reception circuit comprises a plurality of input buffers each having an input coupled to an output terminal of a corresponding driver, an output coupled to a corresponding data terminal, a positive power supply terminal for receiving said I/O power supply voltage, and a negative terminal for receiving said I/O ground voltage.

8. The data transmission system of claim 1, wherein:
said reception circuit is a double data rate (DDR) DRAM; and
said transmission circuit comprises a double data rate (DDR) dynamic random access memory (DRAM) physical interface circuit, said first driver providing a data output signal, said second driver providing a write clock signal, and said third driver providing an inverse write clock signal.

9. The data transmission system of claim 8, wherein said reception circuit uses said output of said second driver and said output of said third driver for another purpose.

10. A data transmission system comprising:
a transmission circuit comprising:
a first driver having an input for receiving a first transmit data signal, an output, a positive power supply terminal for receiving an input/output (I/O) power supply voltage, and a negative terminal for receiving an I/O ground voltage; and
a second driver having an input for receiving a clock signal, an output, and a positive power supply terminal for receiving said I/O power supply voltage, and
a reception circuit coupled to said output of said first driver and said output of said second driver, wherein said reception circuit forms a reference voltage based an average of signal content below a predetermined frequency of said output of said second driver, and receives a signal from said output of said first driver using said reference voltage.

11. The data transmission system of claim 10, wherein said reception circuit comprises:
a lowpass filter having an input coupled to said output of said second driver, and an output; and
a variable voltage source having an input coupled to said output of said lowpass filter, and an output for providing said reference voltage.

12. The data transmission system of claim 10, wherein:
said transmission circuit comprises a plurality of additional drivers each having an input for receiving a corresponding transmit data signal, an output coupled to a corresponding data terminal, a positive power supply terminal for receiving said I/O power supply voltage, and a negative terminal for receiving said I/O ground voltage; and
said reception circuit comprises a plurality of input buffers each having an input coupled to an output terminal of a corresponding driver, an output coupled to a corresponding data terminal, a positive power supply terminal for receiving said I/O power supply voltage, and a negative terminal for receiving said I/O ground voltage.

13. The data transmission system of claim 10, wherein said reception circuit uses said output of said second driver for another purpose.

14. The data transmission system of claim 10, wherein said transmission circuit comprises a double data rate (DDR) dynamic random access memory (DRAM) controller, said first driver provides a data output signal, and said second driver provides a single-ended write clock signal.

15. A data transmission system comprising:
a reference voltage driving circuit comprising:
a first resistor having a first terminal for receiving an input/output (I/O) power supply voltage, and second terminal for coupling to a first end of a first transmission line; and
a second resistor having a first terminal for coupling to a first end of a second transmission line, and a second terminal for receiving an I/O ground voltage,
a first reference voltage forming circuit coupled to a second end of said first transmission line and a second end of said second transmission line, for forming a first reference voltage based an average of signal content below a predetermined frequency of signals at said second ends of said first and second transmission lines; and
a first buffer for receiving a first input signal based on said reference voltage.

16. The data transmission system of claim 15 wherein:
said reference voltage driving circuit, said first transmission line, said second transmission line, and said reference voltage forming circuit are formed on a printed circuit board; and
said first buffer is formed on an integrated circuit.

17. The data transmission system of claim 15 wherein:
said reference voltage driving circuit, said first transmission line, and said second transmission line are formed on a printed circuit board; and
said reference voltage forming circuit and said first buffer and formed on an integrated circuit.

18. The data transmission system of claim 15 further comprising:
a first internal bus connected to said second end of said first transmission line; and
a second internal bus connected to said second end of said second transmission line,
wherein the data transmission system further comprises:
a plurality of additional reference voltage forming circuits each coupled to said first internal bus and said second internal bus, for forming respective reference voltages based said average of signal content below said predetermined frequency of signals on said first internal bus and said second internal bus transmission lines; and a plurality of additional buffers for receiving corresponding ones of a plurality of additional input signals based corresponding ones said plurality of respective reference voltages.

19. The data transmission system of claim 18, wherein:

each of said first reference voltage forming circuit and said plurality of additional reference voltage forming circuits are distributed along and coupled to said first internal bus and said second internal bus; and each of said first buffer and said plurality of additional buffers receive a plurality of additional input signals based said plurality of respective reference voltages.

20. The data transmission system of claim 19, further comprising:

a first power supply bus extending along said first internal bus; and a second power supply bus extending along said second internal bus; and a first plurality of tunable termination circuits distributed along and coupled between said first internal bus and said first power supply bus; and a second plurality of tunable termination circuits distributed along and coupled between said second internal bus and said second power supply bus.

* * * * *